United States Patent
Park et al.

(10) Patent No.: US 9,425,059 B2
(45) Date of Patent: Aug. 23, 2016

(54) METHODS OF FORMING A PATTERN AND METHODS OF MANUFACTURING A SEMICONDUCTOR DEVICE USING THE SAME

(71) Applicant: SAMSUNG ELECTRONICS CO., LTD., Suwon-si, Gyeonggi-do (KR)

(72) Inventors: Ji-Man Park, Hwaseong-si (KR); Hyo-Jin Yun, Suwon-si (KR); Jin-Seo Lee, Anyang-si (KR); Youn-Joung Cho, Hwaseong-si (KR); Jun-Hyun Cho, Hwaseong-si (KR); Jung-Sik Choi, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 222 days.

(21) Appl. No.: 14/143,255

(22) Filed: Dec. 30, 2013

(65) Prior Publication Data
US 2014/0199820 A1    Jul. 17, 2014

(30) Foreign Application Priority Data
Jan. 15, 2013   (KR) .................. 10-2013-0004196

(51) Int. Cl.
  H01L 21/00       (2006.01)
  H01L 21/308      (2006.01)
  H01L 45/00       (2006.01)
  H01L 27/24       (2006.01)

(52) U.S. Cl.
  CPC ........ *H01L 21/3088* (2013.01); *H01L 27/2409* (2013.01); *H01L 27/2463* (2013.01); *H01L 45/06* (2013.01); *H01L 45/1233* (2013.01); *H01L 45/1246* (2013.01); *H01L 45/1683* (2013.01); *H01L 45/144* (2013.01)

(58) Field of Classification Search
  CPC .................. H01L 21/3088; H01L 27/2409
  See application file for complete search history.

(56) References Cited

U.S. PATENT DOCUMENTS

| | | | |
|---|---|---|---|
| 6,500,773 B1 | 12/2002 | Gaillard et al. | |
| 6,720,249 B1 | 4/2004 | Liu et al. | |
| 6,811,960 B2 | 11/2004 | Lee et al. | |
| 7,361,444 B1 | 4/2008 | Angelopoulos et al. | |
| 7,582,412 B2 | 9/2009 | Cameron et al. | |
| 8,119,324 B2 | 2/2012 | Sugita et al. | |
| 2006/0068318 A1* | 3/2006 | Meagley | G03F 7/0392 430/270.1 |
| 2009/0053899 A1* | 2/2009 | Liu | G03F 7/095 438/703 |
| 2009/0148789 A1 | 6/2009 | Amara et al. | |
| 2010/0233632 A1 | 9/2010 | Kawazu et al. | |
| 2010/0291487 A1 | 11/2010 | Nakajima et al. | |
| 2010/0330505 A1 | 12/2010 | Nakajima et al. | |
| 2011/0143149 A1 | 6/2011 | Shibayama et al. | |
| 2011/0275019 A1 | 11/2011 | Yoon et al. | |
| 2011/0287369 A1 | 11/2011 | Shibayama et al. | |
| 2012/0052685 A1 | 3/2012 | Ogihara et al. | |
| 2012/0070994 A1 | 3/2012 | Kanno et al. | |

FOREIGN PATENT DOCUMENTS

| | | |
|---|---|---|
| JP | 2011-213921 A | 10/2011 |
| KR | 10-0819647 B1 | 3/2008 |
| KR | 2010-0099240 A | 9/2010 |

\* cited by examiner

*Primary Examiner* — Bradley K Smith
(74) *Attorney, Agent, or Firm* — Lee & Morse, P.C.

(57) ABSTRACT

A method of forming a pattern includes forming an underlayer on an etching target layer by a chemical vapor deposition (CVD) process, the underlayer including a silicon compound combined with a photoacid generator (PAG), forming a photoresist layer on the underlayer, irradiating extreme ultraviolet (EUV) light on the photoresist layer to form a photoresist pattern, and etching the etching target layer using the photoresist pattern as an etching mask.

17 Claims, 15 Drawing Sheets

METHODS OF FORMING A PATTERN AND METHODS OF MANUFACTURING A SEMICONDUCTOR DEVICE USING THE SAME

CROSS-REFERENCE TO RELATED APPLICATION

Korean Patent Application No. 10-2013-0004196, filed on Jan. 15, 2013, in the Korean Intellectual Property Office, and entitled: "Methods of Forming a Pattern and Methods of Manufacturing a Semiconductor Device Using the Same," is incorporated by reference herein in its entirety.

BACKGROUND

1. Field

Example embodiments relate to methods of forming a pattern and methods of manufacturing a semiconductor device using the same. More particularly, 2. Description of the Related Art As semiconductor devices have been highly integrated, shorter wavelengths have been used for a light source for forming fine patterns.

SUMMARY

Embodiments are directed to a method of forming a pattern including forming an underlayer on an etching target layer by a chemical vapor deposition (CVD) process, the underlayer including a silicon compound combined with a photoacid generator (PAG), forming a photoresist layer on the underlayer, irradiating extreme ultraviolet (EUV) light on the photoresist layer to form a photoresist pattern, etching the etching target layer using the photoresist pattern as an etching mask.

Forming the underlayer on the etching target layer may include combining the PAG with polysiloxane to form a deposition source, and providing the deposition source to the etching target layer using a carrier gas.

The PAG may be present in the deposition source in an amount of about 1 to about 7 percent by weight with respect to the total weight of the deposition source.

Forming the deposition source may further include combining at least one of a cross linking agent and an adhesion reinforcing agent with the polysiloxane.

Forming the deposition source may further include combining an adhesion reinforcing agent including a hydroxyl group with the polysiloxane.

The underlayer may be formed at a temperature of about 80° C. to about 400° C.

Forming the photoresist pattern may include providing an acid to an interface between the photoresist layer and the underlayer, the acid being generated from the PAG by the irradiating of the underlayer by the EUV light, and developing the photoresist layer.

Etching the etching target layer may include etching the underlayer anisotropically using the photoresist pattern as an etching mask to form an underlayer pattern, removing the photoresist pattern, and etching the etching target layer using the underlayer pattern as an etching mask.

The method may further include prior to forming the underlayer, forming a hard mask layer on the etching target layer.

The hard mask layer may include carbon.

Embodiments are also directed to a method of manufacturing a semiconductor device including forming an underlayer pattern on a substrate by a CVD process, the underlayer pattern including a silicon compound combined with a photoacid generator (PAG), forming a diode in a contact hole on the substrate, the contact hole being formed using the underlayer pattern as an etching mask, forming a lower electrode on the diode, forming a phase change material layer pattern on the lower electrode, and forming an upper electrode on the phase change material layer pattern.

Forming the diode in the contact hole on the substrate using the underlayer pattern as an etching mask may include forming a first insulating interlayer on the substrate, forming the contact hole using the underlayer pattern as an etching mask, the contact hole being through the first insulating interlayer and exposing a top surface of the substrate, forming a silicon layer to fill the contact hole, and implanting impurities into the silicon layer.

The method may further include, prior to forming the first insulating interlayer on the substrate, performing an ion implantation process on an upper portion of the substrate to form an impurity region therein. The diode may contact a top surface of the impurity region.

Forming the lower electrode on the diode may include forming a second insulating interlayer on the first insulating interlayer, the second insulating interlayer having an opening therethrough, and the opening partially exposing a top surface of the diode, forming a lower electrode layer pattern on a sidewall of the opening, and partially etching the lower electrode layer pattern.

Forming the underlayer pattern on the substrate may include combining the PAG with polysiloxane to form a deposition source, providing the deposition source to the substrate using a carrier gas to form an underlayer, forming a photoresist layer on the underlayer, irradiating EUV light onto the photoresist layer to form a photoresist pattern, and etching the underlayer anisotropically using the photoresist pattern as an etching mask.

Embodiments are also directed to a method of forming a pattern including forming an underlayer on an etching target layer, the underlayer including a silicon polymer having a photoacid generator (PAG) combined therewith, forming a photoresist layer on the underlayer, irradiating extreme ultraviolet (EUV) light onto the photoresist layer such that an acid generated from the PAG migrates to the photoresist layer, developing the photoresist layer to form a photoresist pattern, and etching the etching target layer using the photoresist pattern as an etching mask.

Forming the underlayer on the etching target layer may include carrying out a chemical vapor deposition (CVD) process in which the silicon polymer having the photoacid generator (PAG) combined therewith is used as a deposition source, the CVD process being carried out at a temperature of about 80° C. to about 400° C.

The underlayer may includes at least one of a hydroxyl group-containing cross linking agent and an adhesion reinforcing agent.

Etching the etching target layer may include etching the underlayer anisotropically using the photoresist pattern as an etching mask to form an underlayer pattern, removing the photoresist pattern, and etching the etching target layer using the underlayer pattern as an etching mask.

The method may further include forming a hard mask layer on the etching target layer prior to forming the underlayer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
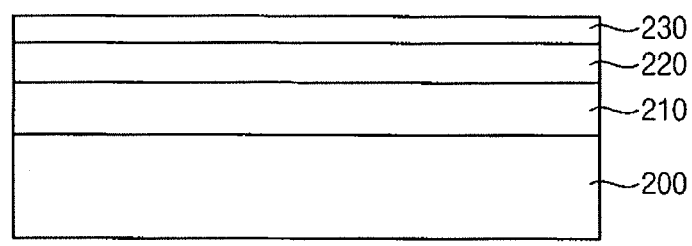
FIGS. 1 to 5 illustrate cross-sectional views depicting stages of a method of forming a pattern in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on" another element or layer, it can be directly on the other element or layer or intervening elements or layers may be present. In contrast, when an element is referred to as being "directly on" another element or layer, there are no intervening elements or layers present. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings thereof.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The terminology used herein is for the purpose of describing particular example embodiments only and is not intended to be limiting thereof. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope thereof.

Unless otherwise defined, all terms (including technical and scientific terms) used herein have the same meaning as commonly understood by one of skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 5 illustrate cross-sectional views depicting stages of a method of forming a pattern in accordance with example embodiments.

Referring to FIG. 1, an underlayer 220 including a silicon compound combined with a photoacid generator (PAG) may be formed on an etching target layer 200 by a chemical vapor deposition (CVD) process, and a photoresist layer 230 may be formed on the underlayer 220.

The underlayer 220 may be formed by combining the PAG with a polysiloxane to form a deposition source, and by providing the deposition source to the etching target layer 200 using a carrier gas including an inert gas such as argon, helium, nitrogen, etc. so that the deposition source may be adsorbed on the etching target layer 200.

The polysiloxane may be any polymer having a siloxane bond, and the polymer may include, for example, monosiloxane, disiloxane, trisiloxane, cyclotetrasiloxane, or the like, as a repeating unit of the polymer.

The PAG may be any compound generating acid by light, and may include, for example, an onium salt including triphenylsulfonium, trifluoromethanesulfonate, an aromatic diazonium salt, a sulfonium salt, a triarylsulfonium salt, a diarylsulfonium salt, a monoarylsulfonium salt, an iodonium salt, a diaryliodonium salt, a nitrobenzyl ester, disulfone, diazodisulfone, sulfonate, trichloromethyl trizine, N-hydroxysuccinimide triflate, or the like.

When the deposition source is formed, if too small amount of the PAG is combined with the polysiloxane, the light sensitivity of the photoresist layer 230 may be reduced. On the other hand, if too much amount of the PAG is combined with the polysiloxane, the light absorption of the underlayer 220 may be increased such that a photoresist pattern 231 (refer to FIG. 3) subsequently formed may be excessively under-cut. Accordingly, in example embodiments, the PAG may be present in the deposition source in an amount of about 1 to about 7 percent by weight with respect to the total weight of the deposition source. However, the amount of the PAG may be varied according to the line width of the pattern to be subsequently formed.

In example embodiments, a cross linking agent and an adhesion reinforcing agent may be further combined with the polysiloxane.

The cross linking agent may cross link the repeating unit of the polysiloxane, and may include, e.g., melamine, urea, polyhydric alcohol, etc.

The adhesion reinforcing agent may improve the adhesion between the underlayer 220 and the photoresist layer 230 such that leaning or collapsing of patterns may be prevented or reduced when the photoresist layer 230 is developed in a subsequent process. In example embodiments, the adhesion reinforcing agent may include a compound including hydroxyl group, such as a compound represented by the following Formula 1 or 2.

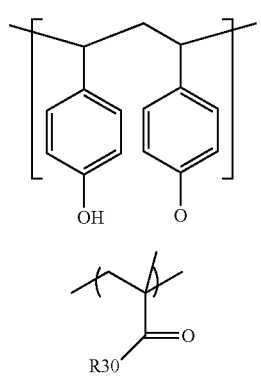

Formula (1)

Formula (2)

In Formula 2, R3 may be represented by following Formula 3.

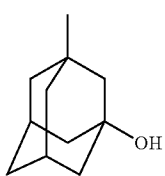

Formula (3)

The PAG, the cross linking agent and the adhesion reinforcing agent may be separated easily from the polysiloxane at a high temperature and under a high pressure. Accordingly, in example embodiments, the underlayer 220 may be formed at a temperature of about 80° C. to about 400° C. and under a pressure of about 760 Torr.

In example embodiments, the deposition source may further include a surfactant in addition to the polysiloxane combined with the PAG and other organic materials such as the cross linking agent or the adhesion reinforcing agent. Examples of the surfactant may include a nonionic surfactant, an anionic surfactant, and/or an amphiprotic surfactant.

The underlayer 220 may include a silicon compound combined with the PAG between the etching target layer 200 and the photoresist layer 230, thereby improving a resolution and sensitivity when fine patterns are formed. Additionally, when the underlayer 220 is formed by a CVD process, the underlayer 220 may be formed to have a high density, and thus, may have a high etch selectivity. Therefore, forming of a hard mask layer that may be used for forming fine patterns may be reduced or minimized.

In example embodiments, before forming the underlayer 220, a hard mask layer 210 may be further formed on the etching target layer 200. In other implementations, forming the hard mask layer 210 may be skipped, depending on the aspect ratio of the pattern to be subsequently formed. When a pattern having a high aspect ratio is to be formed, the hard mask layer 210 may be formed on the etching target layer 200. In this case, the hard mask layer 210 may be formed using a material that may have a different etch selectivity from that of the underlayer 220, e.g., carbon.

Figure 2:
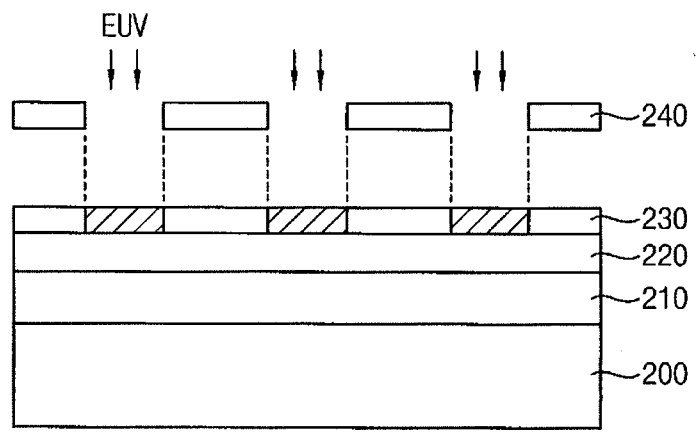

Referring to FIG. 2, EUV light may be irradiated on the photoresist layer 230 using an exposure mask 240. Accordingly, a portion of the photoresist layer 230 exposed by the EUV light may be cured so that the photoresist layer 230 is divided into an exposed portion and unexposed portion.

Unlike light of other wavelengths, the EUV light may be absorbed by or pass through the etching target layer 200. Accordingly, when the EUV light is irradiated, acid may be generated from the underlayer 220 to be provided to an interface between the photoresist layer 230 and the underlayer 220.

Figure 3:
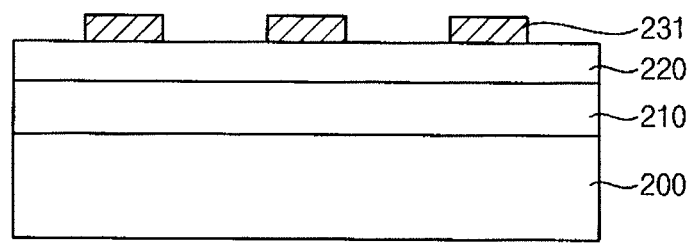

Referring to FIG. 3, the photoresist layer 230 may be developed to form a photoresist pattern 231. The unexposed portion of the photoresist layer 230 may be dissolved by a developing process, and the exposed portion of the photoresist layer 230 may remain on the underlayer 220.

The acid generated during the exposure process may affect the cross-sectional shape of the exposed portion. Therefore, in example embodiments, the photoresist pattern 231 may be formed to have a substantially vertical sidewall with respect to a top surface of the etching target layer 200.

Moreover, when the underlayer 220 includes the adhesion reinforcing agent, leaning or collapsing of the photoresist pattern 231 from the etching target layer 200 during the developing process may be avoided, and the photoresist pattern 231 may be formed easily.

Figure 4:
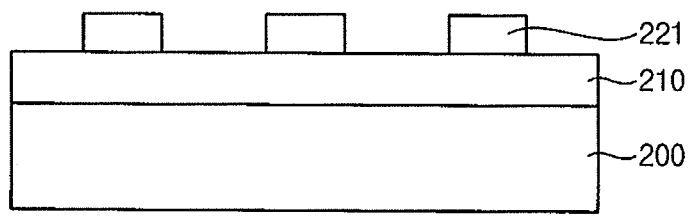

Referring to FIG. 4, the underlayer 220 may be etched anisotropically using the photoresist pattern 231 as an etching mask to form an underlayer pattern 221.

The underlayer pattern 221 may be formed by, e.g., a dry etching process.

The photoresist pattern 231 may be removed by, e.g., a wet etching process.

Figure 5:
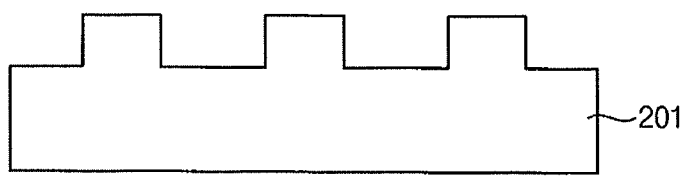

Referring to FIG. 5, the etching target layer 200 may be etched using the underlayer pattern 221 as an etching mask.

The underlayer pattern 221 may have a high etch selectivity with respect to the etching target layer 200, so that fine patterns may be formed easily using the underlayer pattern 221 as an etching mask.

In example embodiments, when the hard mask layer 210 including a material having an etch selectivity different from that of the underlayer pattern 221, e.g., carbon, is formed on the etching target layer 200, the hard mask layer 210 may be etched using the underlayer pattern 221 as an etching mask to form a hard mask layer pattern (not illustrated). After the underlayer pattern 221 is removed by, e.g., a wet etching process, the etching target layer 200 may be etched using the hard mask layer pattern as an etching mask. In this case, due to the etch selectivities of the underlayer pattern 221 and the hard mask layer pattern that are different from each other, fine patterns having a higher aspect ratio may be formed easily.

As described above, when the fine patterns are formed using EUV light, the underlayer 220 may be formed between the etching target layer 200 and the photoresist layer 230 using the silicon compound combined with the PAG, so that the resolution and sensitivity may be improved.

Moreover, when the underlayer 220 is formed by a CVD process, the underlayer 220 may have a higher etch selectivity with respect to the etching target layer 200 and the photoresist layer 230. Thus, forming the hard mask layer 210 for forming fine patterns having a high aspect ratio may be reduced or minimized. Therefore, advantages of simplification and improvement of the efficiency of processes may be provided.

Figure 29:
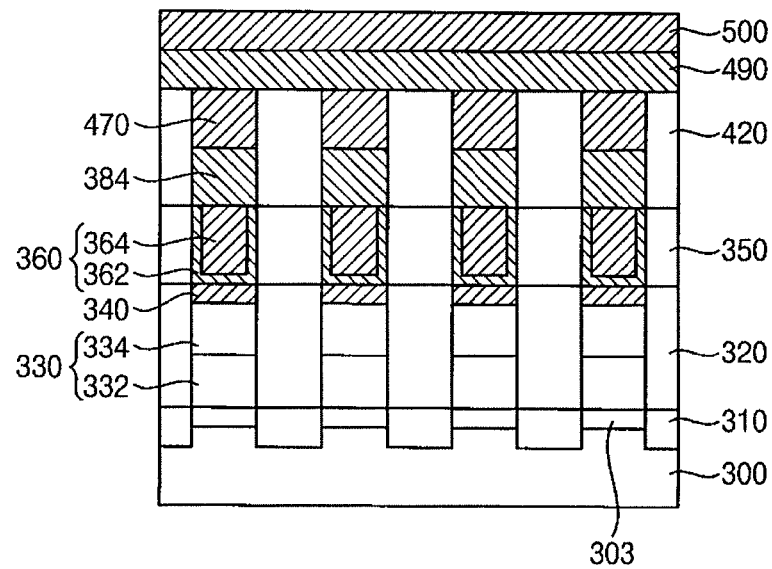
Figure 30:
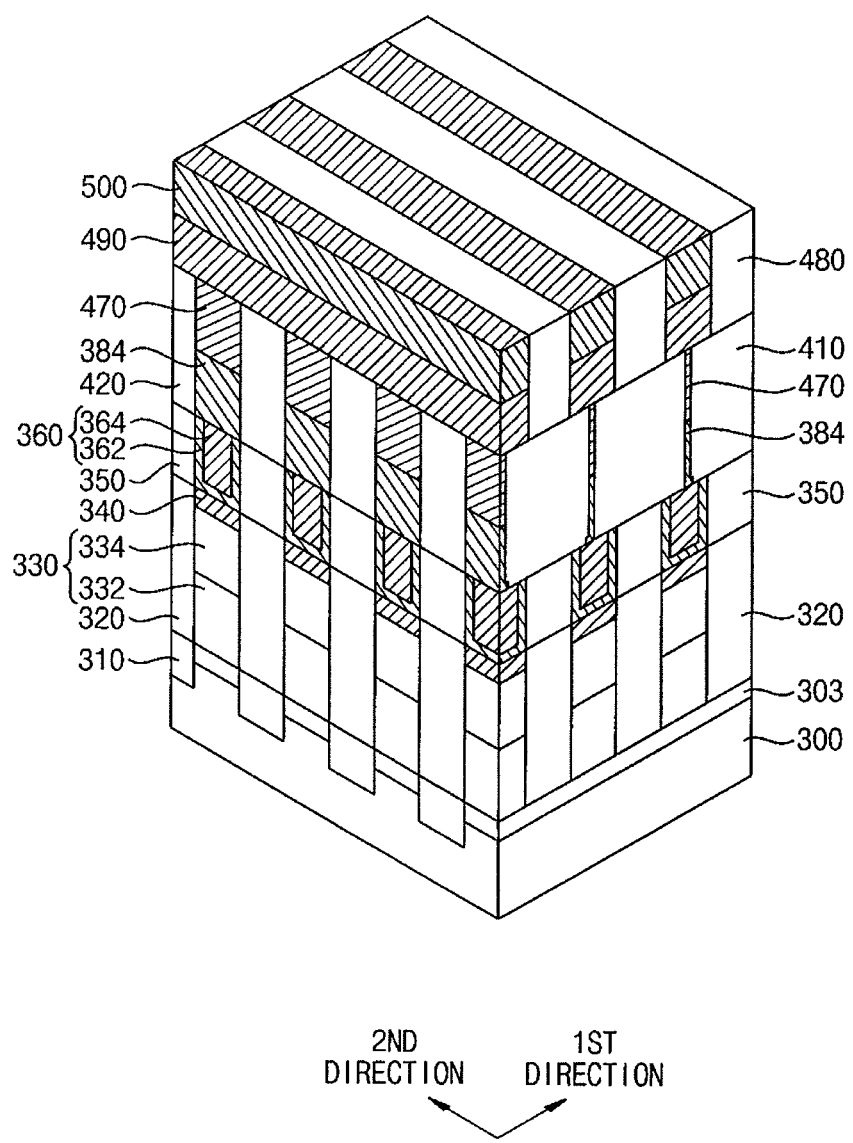
FIG. 30 illustrates a perspective view illustrating a stage of the method of manufacturing the semiconductor device in accordance with example embodiments.

FIGS. 6 to 29 illustrate cross-sectional views illustrating stages of a method of manufacturing a semiconductor device in accordance with example embodiments, and FIG. 30 is a perspective view illustrating a stage of the method of manufacturing the semiconductor device in accordance with example embodiments. In particular, FIGS. 6, 8, 10, 12, 14, 16, 18, 20, 22, 24, 26, and 28 illustrate cross-sectional views of the semiconductor device cut along a first direction, and FIGS. 7, 9, 11, 13, 15, 17, 19, 21, 23, 25, 27, and 29 illustrate cross-sectional views of the semiconductor device cut along a second direction substantially perpendicular to the first direction.

Figure 6:
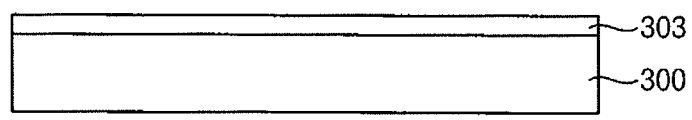
FIGS. 6 to 29 illustrate cross-sectional views depicting stages of a method of manufacturing a semiconductor device in accordance with example embodiments.
Figure 7:
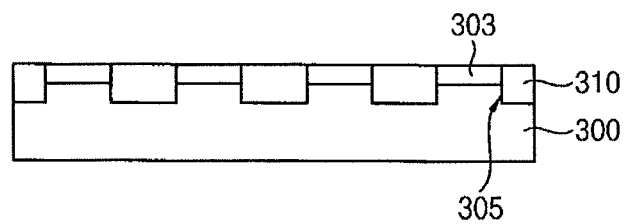

Referring to FIGS. 6 and 7, after an impurity region is formed by an ion implantation process on an upper portion of a substrate 300, an isolation layer pattern 310 may be formed at an upper portion of the substrate 300 to divide the substrate 300 into an active region and a field region, and word lines 303 may be formed.

The impurity region may be formed by implanting first impurities, e.g., n-type impurities such as phosphorus, arsenic, etc., or p-type impurities such as boron, gallium, etc., into the upper portion of the substrate 300. In an example embodiment, the first impurities may be n-type impurities. Before forming the impurity region, a well region (not illustrated) doped with impurities of conduction type different from that of the first impurities may be formed in the substrate 300.

In example embodiments, the isolation layer pattern 310 may be formed by a shallow trench isolation (STI) process. That is, after trenches 305 are formed on the substrate 300, an isolation layer (not illustrated) may be formed on the substrate 300 to sufficiently fill the trenches 305, and an upper portion of the isolation layer may be planarized until a top surface of the substrate 300 is exposed to form the isolation layer pattern 310. The isolation layer may be formed using a silicon oxide, e.g., boro phospho silicate glass (BPSG), phospho silicate glass (PSG), undoped silicate glass (USG), flowable oxide (FOX), tetra ethyl ortho silicate (TEOS), plasma enhanced tetra ethyl ortho silicate (PE-TEOS), high density plasma chemical vapor deposition (HDP-CVD) oxide, etc. In example embodiments, the planarization process may be performed by a chemical mechanical polishing (CMP) process and/or an etch back process. In example embodiments, the isolation layer pattern 310 may be formed to extend in a first direction parallel to the top surface of the substrate 300, and a plurality of isolation layer patterns 310 may be formed in a second direction substantially perpendicular to the first direction. Accordingly, the active region of the substrate 300 may be also formed to extend in the first direction, and a plurality of active regions may be formed in the second direction.

In example embodiments, the isolation layer patterns 310 may be formed to have a bottom surface lower than that of the impurity region Thus, the impurity region formed in an upper portion of the active region may be divided into a plurality of word lines 303 by the isolation layer patterns 310. In example embodiments, each word line 303 may extend in the first direction, and a plurality of word lines 303 may be formed in the second direction.

Figure 8:
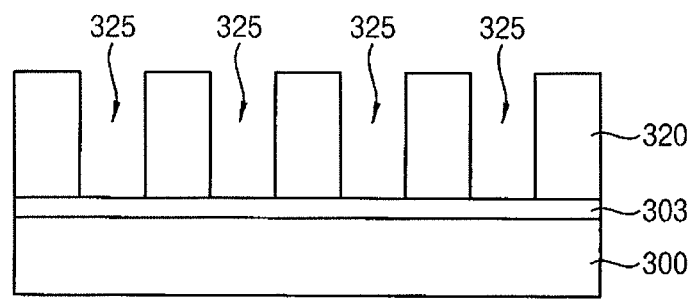
Figure 9:
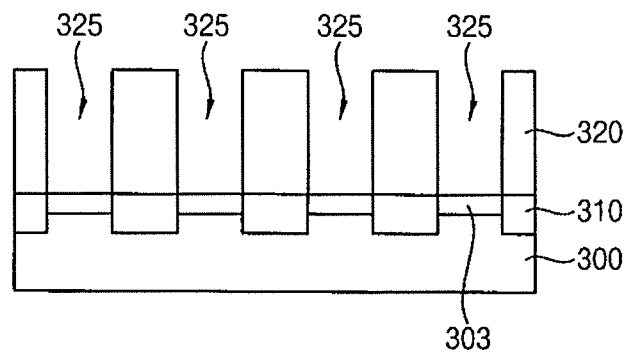

Referring to FIGS. 8 and 9, processes substantially the same as or similar to those illustrated with reference to FIGS. 1 to 5 may be performed, so that a first insulating interlayer 320 having a plurality of first contact holes 325 that arranged in both of the first and second directions at regular distances are formed on the substrate 300 and the isolation layer pattern 310.

The first insulating interlayer 320 and an underlayer pattern (refer to FIGS. 1 to 5) may be sequentially formed on the substrate 300, and the first insulating interlayer 320 may be etched using the underlayer pattern as an etching mask to form the first contact holes 325. Accordingly, the first contact holes 325 may be formed through the first insulating interlayer 320 to expose top surfaces of the word lines 303 of the substrate 300, and may form a first contact hole array.

The underlayer pattern may be formed as follows. After an underlayer including a silicon compound combined with a PAG is formed on the first insulating interlayer 320 by a CVD process, a photoresist pattern may be formed on the underlayer, and the underlayer may be etched anisotropically using the photoresist pattern as an etching mask to form the underlayer pattern.

The underlayer may be formed by using a polysiloxane combined with the PAG as a deposition source, and by providing the deposition source to the first insulating interlayer 320 using a carrier gas. In example embodiments, a cross linking agent and/or an adhesion reinforcing agent may be further combined with the polysiloxane. The deposition source may further include a surfactant in addition to the polysiloxane combined with the PAG and other organic materials such as the cross linking agent or the adhesion reinforcing agent.

As described above, the underlayer pattern may include a large amount of silicon combined with the organic materials and may be formed by a CVD process. Thus the underlayer pattern may have a high etch selectivity with respect to the first insulating interlayer 320 and the photoresist pattern. As a result, use of a hard mask to provide a desired aspect ratio of a contact hole may be reduced or minimized, and also resolution and sensitivity may be improved.

The photoresist pattern may be formed by forming a photoresist layer on the underlayer, performing an exposing process using EUV light, and developing the photoresist layer.

Unlike light of other wavelengths, the EUV light may be absorbed by or pass through the substrate 300. Accordingly, an acid may be generated from the underlayer by the effect of the EUV light, and the acid may be provided to an interface between the underlayer and the photoresist layer. Thus, the photoresist pattern may be formed to have a substantially vertical sidewall with respect to the top surface of the substrate 300.

Moreover, the underlayer may include the adhesion reinforcing agent. Thus leaning or collapsing of the photoresist pattern from the substrate 300 during the developing process may be avoided, and the photoresist pattern may be formed more easily.

Before forming the underlayer pattern, a hard mask layer may be further formed on the first insulating interlayer 320 in accordance with a desired width of the first contact holes 325. In this case, after the hard mask layer is etched using the underlayer pattern as an etching mask to form a hard mask layer pattern, the underlayer pattern may be removed by, e.g., a wet etching process, and the first insulating interlayer 320 may be etched using the hard mask layer pattern as an etching mask to form the first contact holes 325.

The hard mask layer may include a material that has a different etch selectivity from that of the underlayer pattern, e.g., carbon. The first insulating interlayer 320 may include an insulating material such as an oxide, a nitride, and the like.

Figure 10:
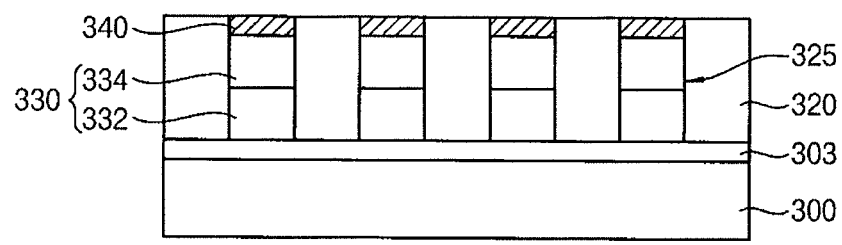
Figure 11:
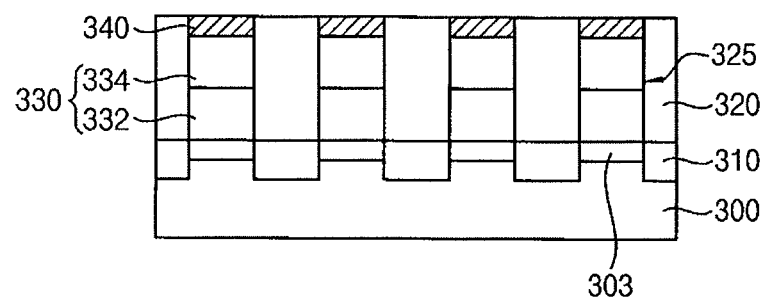

Referring to FIGS. 10 and 11, a diode 330 and an ohmic pattern 340 may be formed sequentially to fill each first contact hole 325.

In example embodiments, a selective epitaxial growth (SEG) process may be performed using the exposed top surfaces of the word lines 303 as a seed layer to form a silicon layer filling the first contact holes 325, and second and third impurities may be implanted into lower and upper portions of the silicon layer, respectively, to form the diode 330. Accordingly, the lower and the upper portions of the silicon layer may be defined as a lower diode layer 332 and an upper diode layer 334, respectively, and the lower diode layer 332 may contact the top surfaces of the word lines 303. Before implanting the second and third impurities thereinto, a planarization process may be further performed on a top surface of the silicon layer, so that a top surface of the diode 330 may have a height substantially the same as that of the first insulating interlayer 320.

In an example embodiment, the second impurities may include n-type impurities, e.g., phosphorous, arsenic, etc., and the third impurities may include p-type impurities, e.g., boron, gallium, etc.

In example embodiments, a metal layer may be formed on the diode 330 and the first insulating interlayer 320. The metal layer and silicon of the diode 330 may be reacted with each other by a heat treatment process to form the ohmic pattern 340. The ohmic pattern 340 may reduce a contact resistance between the diode 330 and a contact plug 360 (refer to FIGS. 14 and 15) subsequently formed. In example embodiments, the metal layer may include a metal such as cobalt, nickel, tungsten, etc., and thus the ohmic pattern 340 may include a metal silicide such as cobalt silicide, nickel silicide, tungsten silicide, etc. A portion of the metal layer that has not been reacted may be removed.

In other implementations, the ohmic pattern 340 may be formed by directly implanting metal ions into an upper portion of the diode 330. In some implementations, the process of forming the ohmic pattern 340 may be skipped.

The diode 330 and the ohmic pattern 340 may be formed in each first contact hole 325. Thus, a plurality of diodes 330 and a plurality of ohmic patterns 340 may be formed to form a diode array and an ohmic pattern array, respectively.

Figure 12:
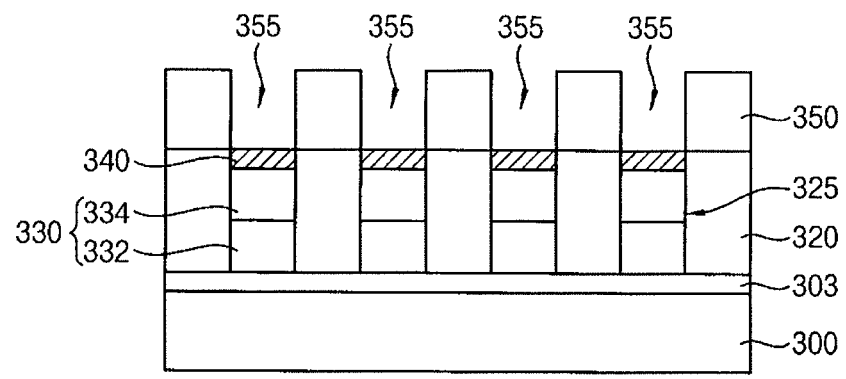
Figure 13:
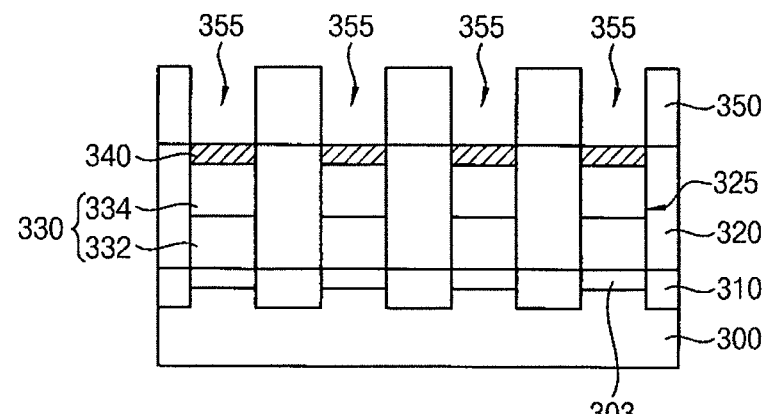

Referring to FIGS. 12 and 13, processes substantially the same as or similar to those illustrated with reference to FIGS. 1 to 5, or FIGS. 8 and 9 may be performed, so that a second insulation layer 350 having a plurality of second contact holes 355 that are arranged in the first and second directions at regular distances, are formed on the first isolation layer pattern 320 and the ohmic pattern 340.

After the second insulation layer 350 and an underlayer pattern according to example embodiments are formed sequentially on the first isolation layer pattern 320 and the ohmic pattern 340, the second insulation layer 350 may be etched using the underlayer pattern as an etching mask to form the second contact holes 355. Accordingly, the second contact holes 355 may be formed through the second insulating interlayer 350 to expose top surfaces of the ohmic patterns 340, and may form a second contact hole array.

For example, the underlayer pattern may include the silicon compound combined with PAG and may be formed by a CVD process. The underlayer pattern may have a high etch selectivity with respect to the second insulation interlayer 350. Accordingly, even though the second contact holes 355 may have a high aspect ratio, use of a hard mask to provide a desired aspect ratio of the second contact holes 355 may be reduced or minimized.

The second insulation interlayer 350 may include an insulating material such as an oxide, a nitride, etc.

Figure 14:
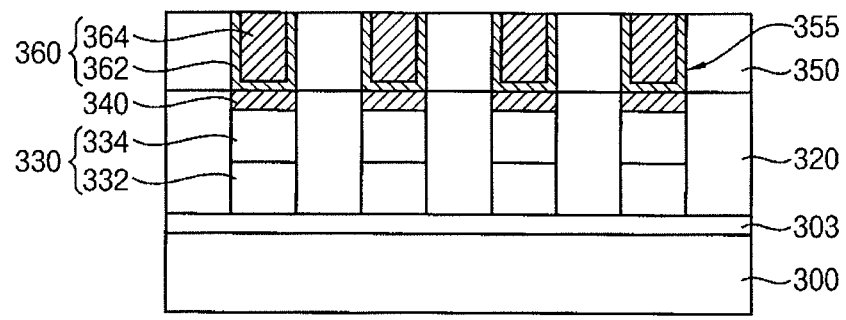
Figure 14:
Figure 15:
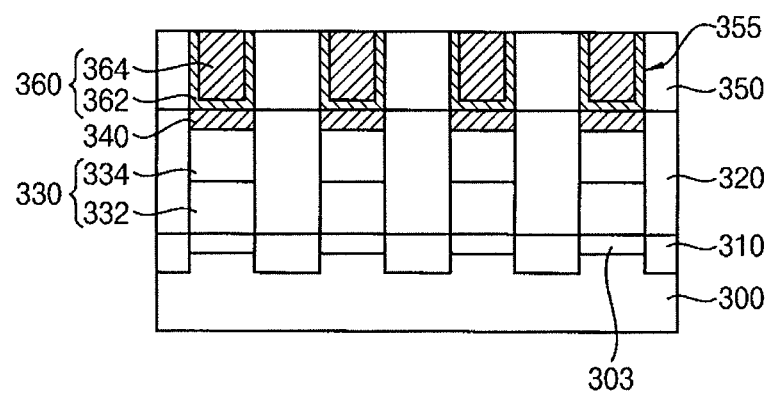
Figure 15:

Referring to FIGS. 14 and 15, a contact plug 360 may be formed to fill each second contact hole 355. A plurality of contact plugs 360 may be formed both in the first and in the second direction to form a contact plug array.

In example embodiments, the contact plug 360 may be formed by forming a first barrier layer on the exposed top surfaces of the ohmic patterns 340, sidewalls of the second contact holes 355 and a top surface of the second insulation layer 350, by forming a first conductive layer on the first barrier layer to sufficiently fill remaining portions of the second contact holes 355, and by planarizing an upper portion of the first barrier layer and the first conductive layer until a top surface of the second insulation layer 350 is exposed. Thus, the contact plug 360 may be formed to include a first barrier layer pattern 362 and a first conductive layer pattern 364. The first barrier layer pattern 362 may surround a sidewall and a bottom of the first conductive layer pattern 364.

The first barrier layer may include a metal or a metal nitride, e.g., titanium, titanium nitride, etc., and the first conductive layer may include a low resistance metal, e.g., copper, tungsten, aluminum, etc.

In other implementations, the contact plug 360 may not be formed. Instead, the process of forming the contact plug 360 may be skipped.

Figure 16:
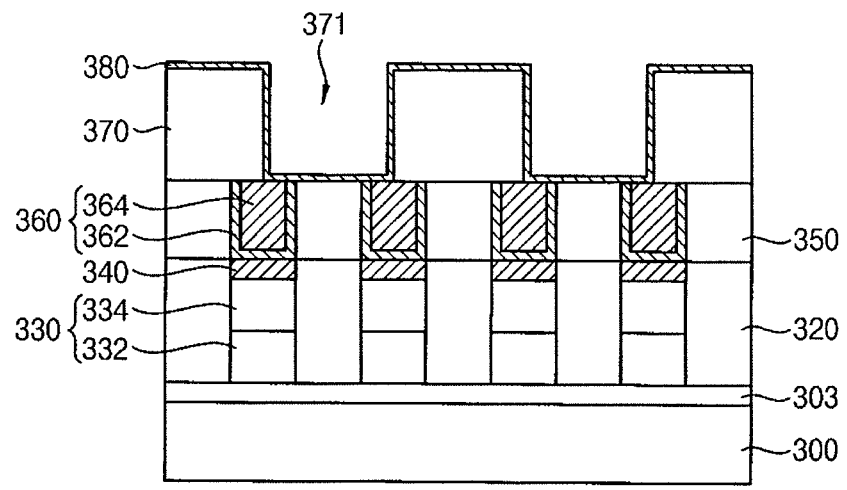
Figure 17:
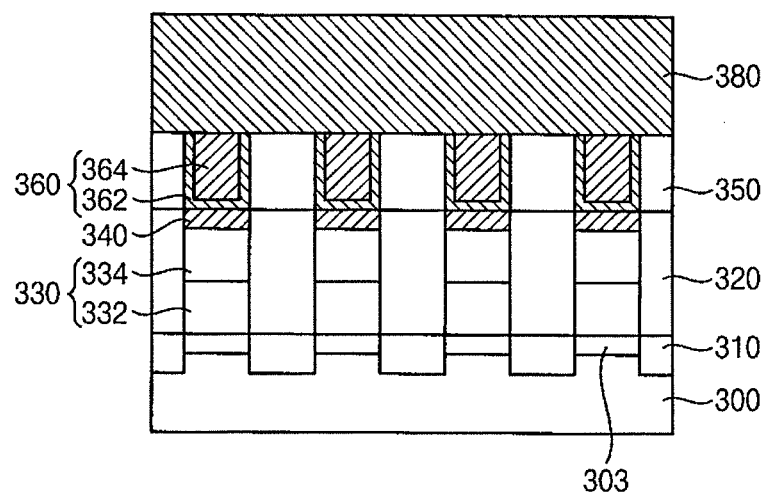

Referring to FIGS. 16 and 17, a third insulation layer 370 having a first opening 371 partially exposing a top surface of the contact plugs 360 may be formed on the second insulation layer 350, and a lower electrode layer 380 may be formed on a sidewall of the first opening 371, the exposed top surface of the contact plug 360, the second insulation layer 350, and the third insulation layer 370.

In example embodiments, a plurality of first openings 371 may be formed in the first direction, and each first opening 371 may extend in the second direction. Two contact plugs 360 adjacent to each other in the first direction may be exposed by the same first opening 371.

The lower electrode layer 380 may include a metal compound such as a metal, a metal nitride, or a metal silicon nitride. The lower electrode layer 380 may be conformally formed on the exposed top surfaces of the contact plugs 360 and the second insulation layer 350, the sidewalls of the first openings 371, and the top surface of the third insulation layer 370.

The third insulating interlayer 370 may include an insulating material such as an oxide, a nitride, etc.

Figure 18:
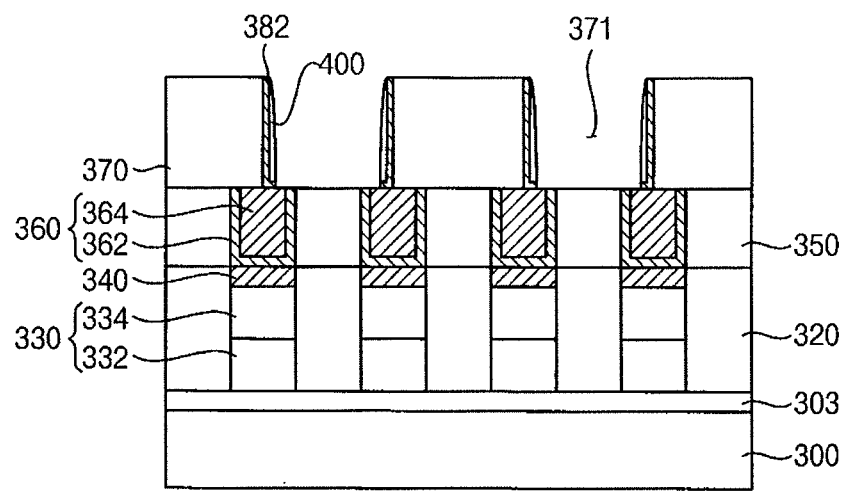
Figure 19:
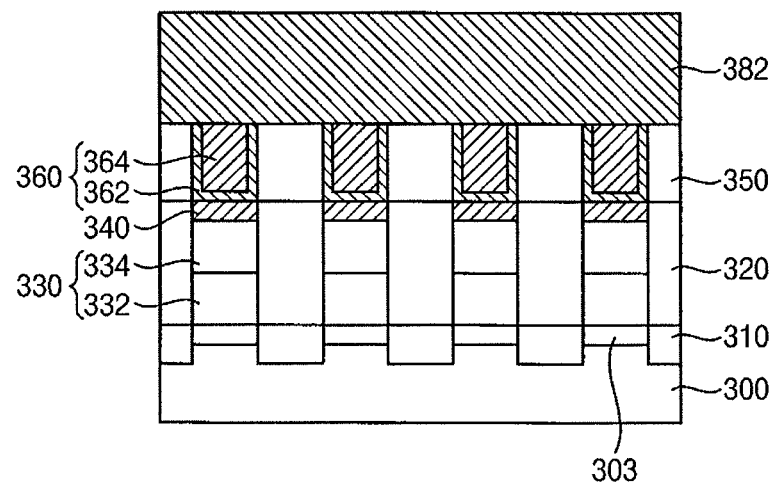

Referring to FIGS. 18 and 19, a spacer 400 may be formed on the lower electrode layer 380, and the lower electrode layer 380 may be etched using the spacer 400 as an etching mask to form a lower electrode pattern 382.

The spacer 400 may be formed by forming a spacer layer on the lower electrode layer 380, and etching the spacer layer anisotropically. Two spacers 400 may be formed in the first opening 371. Just as the plurality of first openings 371 may be formed in the first direction, a plurality of spacers 400 also may be formed in the first direction.

Accordingly, the lower electrode layer pattern 382 may be formed to extend in the second direction on the sidewall of the first opening 371, and a plurality of first electrode layer patterns 382 may be arranged in the first direction. The lower electrode layer 380 may be conformally formed on the sidewall of the first opening 371 and the exposed top surface of the contact plug 360. Each lower electrode layer pattern 382 may have a cross-section cut along the first direction such that each lower electrode layer pattern 382 may have an "L" shape or a "J-like" shape. Due to the "L" shaped cross-section of the lower electrode layer pattern 382, a contact area between the lower electrode layer pattern 382 and the contact plug 360 may be larger than that between the lower electrode layer pattern 382 and the phase change materials layer pattern 470 (refer to FIGS. 26 and 27) to be subsequently formed. Accordingly, the phase change material layer pattern 470 may be efficiently heated even with a small current.

The spacer layer may include an insulating material substantially the same as that of the third insulation layer 370, such as an oxide, a nitride, etc.

Figure 20:
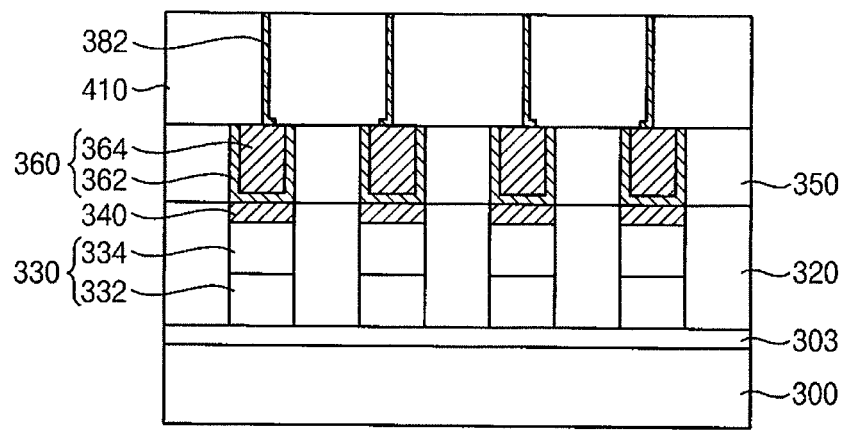
Figure 21:
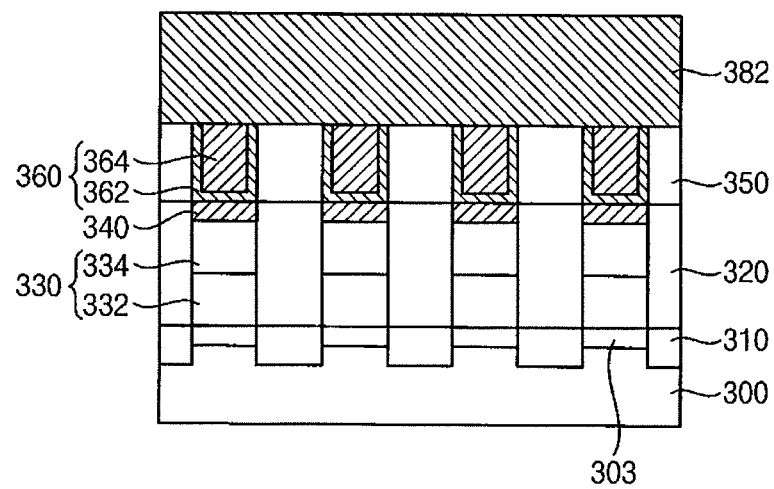

Referring to FIGS. 20 and 21, a fourth insulation layer sufficiently filling remaining portions of the first opening 371 may be formed on the exposed top surfaces of the contact plugs 360 and the second insulation layer 350, the spacers 400, the lower electrode layer patterns 382 and a top surface of the third insulation layer 370, and may be planarized until top surfaces of the lower electrode layer patterns 382 are exposed.

The fourth insulation layer may include an insulating material substantially the same as that of the third insulation layer 370 and the spacer 402, such as an oxide, a nitride, etc. Thus, the fourth insulation layer, the spacer 400 and the third insulation layer 370 may be merged. Hereinafter, the merged layer may be referred to simply as a fourth insulation layer 410. The fourth insulation layer 410 may surround sidewalls of the lower electrode layer patterns 382, and may be formed on the contact plugs 360 and the second insulation layer 350.

Figure 22:
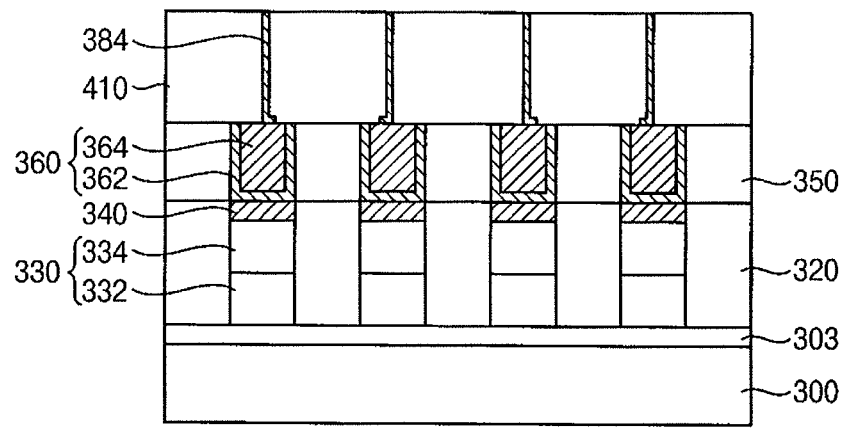
Figure 23:
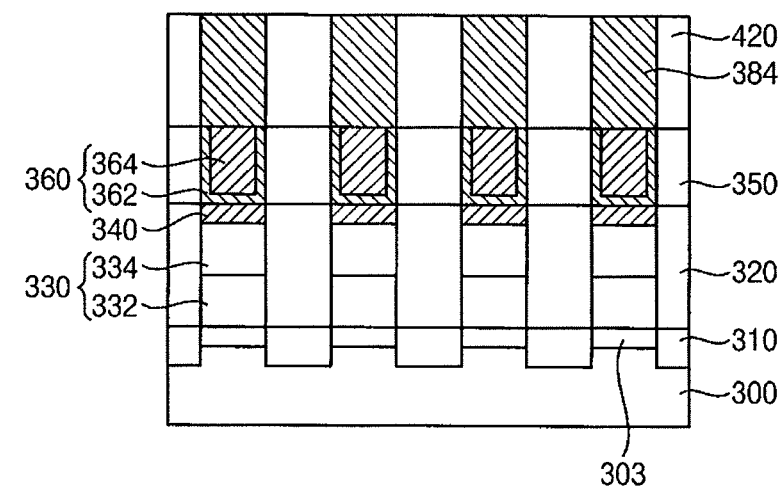

Referring FIGS. 22 and 23, the lower electrode pattern 382 may be partially etched by an etching process using a photoresist pattern (not illustrated) extending in the second direction to form a plurality of lower electrodes 384 in the first direction. The plurality of lower electrode patterns 382 may be arranged in the first direction, and thus the plurality of lower electrodes 384 may also be arranged in the first direction. Accordingly, a lower electrode array including the plurality of lower electrodes 384, which are arranged both in the first and second directions, may be formed.

When the lower electrode pattern 382 is etched, the fourth insulation layer 410 may be also partially etched to form a second opening, and a fifth insulation layer 420 may be formed to fill the second opening.

Figure 24:
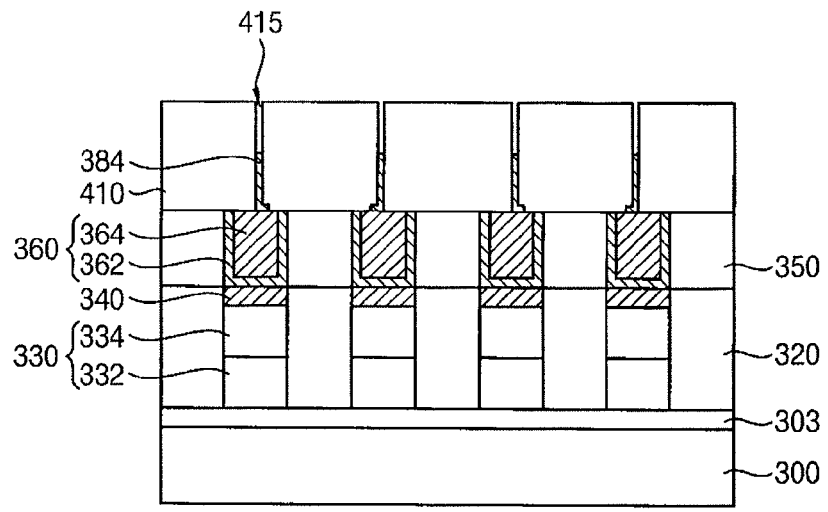
Figure 25:
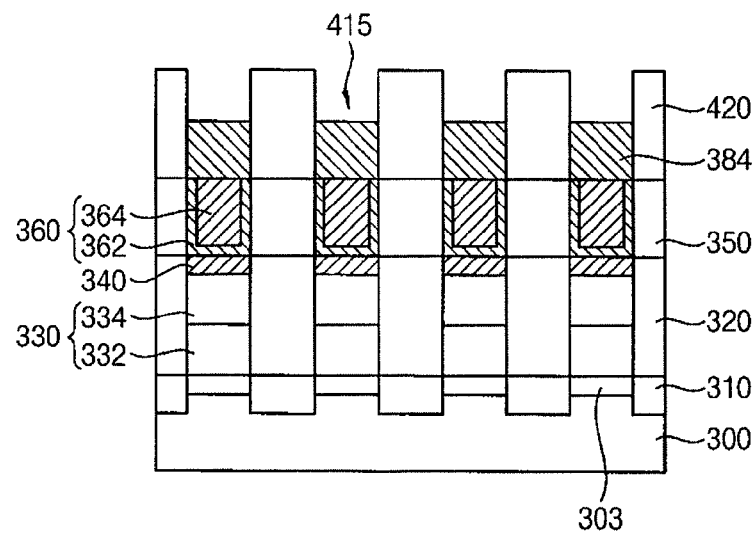

Referring to FIGS. 24 and 25, an upper portion of each lower electrode 384 may be removed to form a recess 415.

In example embodiments, the lower electrodes 384 may be partially removed by, e.g., a wet etching process. The plurality of lower electrodes 384 may be arranged both in the first and second directions to form the lower electrode array. Thus, a plurality of recesses 415 may be formed both in the first and second directions to form a recess array.

Figure 26:
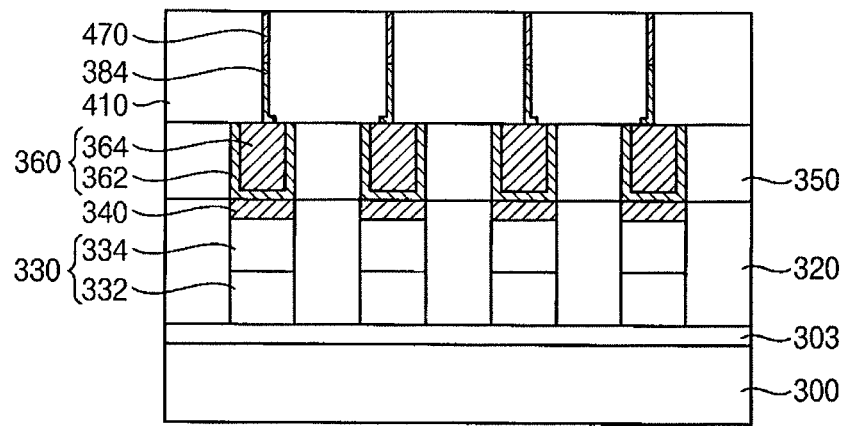
Figure 27:
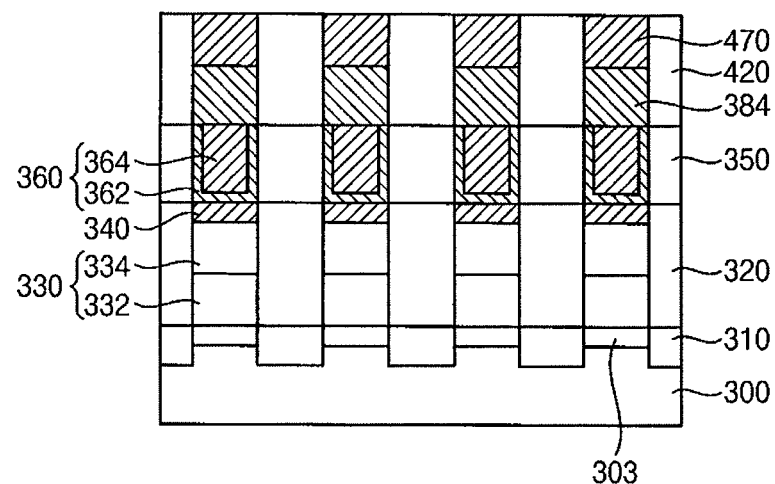

Referring to FIGS. 26 and 27, a phase change material layer pattern 470 may be formed to fill each recess 415. Accordingly, a plurality of phase change material layer patterns 470 may be formed on top surfaces of lower electrodes 384 arranged both in the first and second directions to form a phase change material layer pattern array.

In example embodiments, a phase change material layer may be formed on the lower electrodes 384 and the fourth and fifth insulation layer patterns 410 and 420 to fill the recesses 415. The phase change material layer may be planarized until a top surface of the fourth and fifth insulation layer patterns 410 and 420 are exposed to form the phase change material layer pattern 470. In example embodiments, the phase change material layer may be formed using a chalcogen material, e.g., GeSbTe (GST) or a chalcogen material doped with carbon, nitrogen and/or a metal.

Figure 28:
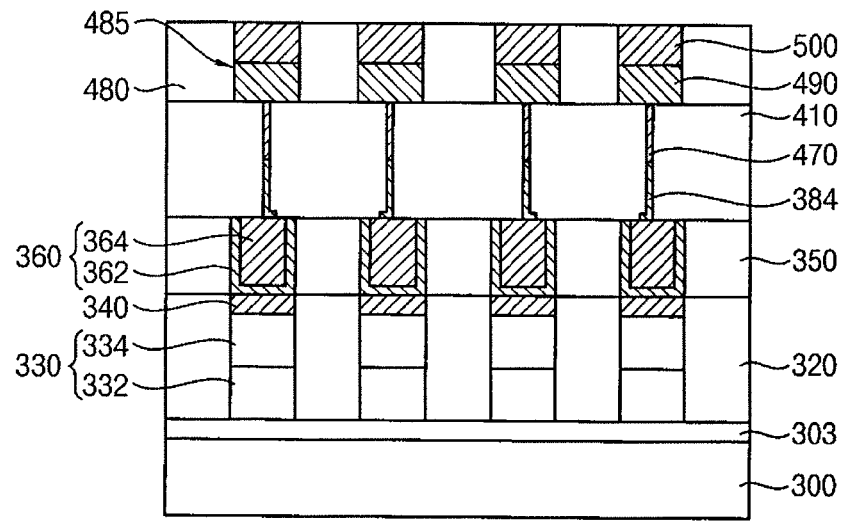

Referring to FIGS. 28 to 30, a sixth insulation layer 480 having a plurality of third openings 485 each of which expose a top surface of the phase change material layer pattern 470 may be formed on the fourth and fifth insulation layer patterns 410 and 420, and an upper electrode 490 and a bit line 500 filling each third opening 485 may be sequentially formed.

The upper electrode 490 may be formed as follows. After a second conductive layer is formed on the exposed top surfaces of the phase change material layer patterns 470 and top surfaces of the fourth to sixth insulation layer patterns 410, 420 and 480 to sufficiently fill the third openings 485, the second conductive layer may be planarized until the top surface of the sixth insulation layer 480 is exposed. Upper portions of the planarized second conductive layer may be removed by, e.g., a wet etching process, to form the upper electrode 490. The upper electrode 490 may be formed to cover the top surface of each phase change material layer pattern 470.

A third conductive layer may be formed on top surfaces of the upper electrodes 490 and the sixth insulation layer 480 to sufficiently fill spaces from which the upper portions of the second conductive layer are removed. The third conductive layer may be planarized until the top surface of the sixth insulation layer 480 is exposed to form the bit line 500.

In example embodiments, the plurality of third openings 485 may be formed in the first direction, and thus a plurality of upper electrodes 490 may be also formed in the first direction to form an upper electrode column. As a result, a plurality of bit lines 500 may be also formed in the first direction.

In example embodiments, the sixth insulating interlayer 480 may include an insulating material such as an oxide, a nitride, etc. The second conductive layer may be formed to include, e.g., a metal, a metal nitride, a metal silicide, etc. The third conductive layer may be formed to include a low resistance metal, e.g., copper, aluminum, tungsten, etc.

In an example embodiment, the bit line 500 may have a barrier layer pattern (not illustrated) including, e.g., a metal nitride.

By way of summation and review, example embodiments relate to methods of forming a pattern using extreme ultraviolet (EUV) lithography and methods of manufacturing a semiconductor device using the same. When a KrF excimer or ArF excimer laser is used as the light source, controlling the diffused reflection from an etching target layer is desirable and a process for forming an anti-reflection coating (ARC) between the etching target layer and a photoresist layer may be used. In order to reduce such an additional process, a method of forming fine patterns using EUV, which may be absorbed in or pass through the etching target layer, as the light source has been developed. In a method of manufacturing a semiconductor device, a hard mask layer, an anti-reflection coating (ARC) and a photoresist layer may be sequentially formed on a substrate, and an exposure process and a developing process may be performed to form fine patterns for circuit configuration. The hard mask layer may be formed to have a multi-layered structure using materials having different etch selectivities, for example, ACL, C-SOH, PE-SION, and the like.

EUV light may be absorbed by or pass through a substrate. Thus, the ARC may be omitted when EUV light is used. However, an underlayer (UL) may be formed due to a difference of chemical properties between the substrate or the hard mask layer and the photoresist layer.

Example embodiments provide a method of forming a fine pattern effectively using EUV lithography.

Example embodiments provide a method of manufacturing a semiconductor device using EUV lithography.

According to example embodiments, the underlayer may be formed between the etching target layer and the photoresist layer using the silicon compound having the PAG, so that resolution and sensitivity may be improved when fine patterns are formed. Additionally, the underlayer formed by a CVD process may have a high selectivity with respect to the etching target layer and the photoresist, and thus the use of a hard mask layer required for forming fine patterns having a high aspect ratio may be reduced or minimized. Therefore, embodiments may have the advantages of simplification and improvement of the efficiency of processes.

According to embodiments, in order to improve the resolution and sensitivity to get a favorable pattern shape without any further processes, at least one of a photoacid generator (PAG), a cross linking agent and an adhesion reinforcing agent is synthesized with a terminal of a silicon polymer to form a precursor. The precursor is deposited on a substrate by a chemical vapor deposition (CVD) process. Accordingly, an underlayer for EUV having a high etch selectivity may be formed because the underlayer includes a large amount of silicon and is formed with a high density. Thus, the underlayer may satisfy the chemical properties of a conventional underlayer as well as the physical properties so that the underlayer may substitute for a PE-SION layer of the hard mask layer. Therefore, embodiments may provide benefits of improving resolution and sensitivity, simplifying and improving the efficiency of the processes.

As described above, the underlayer may be formed on the substrate using the silicon compound combined with the PAG. Contact holes having a high aspect ratio may be formed easily.

Furthermore, when the underlayer is formed by a CVD process, the underlayer may have a high etch selectivity, so that the use of a hard mask layer to manufacture a semiconductor device with a high integration degree may be reduced or minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof.

What is claimed is:

1. A method of forming a pattern, the method comprising:
    forming an underlayer on an etching target layer by a chemical vapor deposition (CVD) process, the underlayer including a silicon compound combined with a photoacid generator (PAG), wherein forming the underlayer on the etching target layer includes combining the PAG, and at least one of a cross linking agent and an adhesion reinforcing agent with polysiloxane to form a deposition source and providing the deposition source to the etching target layer using a carrier gas;
    forming a photoresist layer on the underlayer;
    irradiating extreme ultraviolet (EUV) light on the photoresist layer to form a photoresist pattern; and
    etching the etching target layer using the photoresist pattern as an etching mask.

2. The method as claimed in claim 1, wherein the PAG is present in the deposition source in an amount of about 1 to about 7 percent by weight with respect to the total weight of the deposition source.

3. The method as claimed in claim 1, wherein:
    forming the deposition source further includes combining an adhesion reinforcing agent including a hydroxyl group with the polysiloxane.

4. The method as claimed in claim 1, wherein the underlayer is formed at a temperature of about 80° C. to about 400° C.

5. The method as claimed in claim 1, wherein forming the photoresist pattern includes:
    providing an acid to an interface between the photoresist layer and the underlayer, the acid being generated from the PAG by the irradiating of the underlayer by the EUV light; and
    developing the photoresist layer.

6. The method as claimed in claim 1, wherein etching the etching target layer includes:
    etching the underlayer anisotropically using the photoresist pattern as an etching mask to form an underlayer pattern;
    removing the photoresist pattern; and
    etching the etching target layer using the underlayer pattern as an etching mask.

7. The method as claimed in claim 1, further comprising, prior to forming the underlayer, forming a hard mask layer on the etching target layer.

8. The method as claimed in claim 7, wherein the hard mask layer includes carbon.

9. A method of manufacturing a semiconductor device, the method comprising:
    forming an underlayer pattern on a substrate by a CVD process, the underlayer pattern including a silicon compound combined with a photoacid generator (PAG);
    forming a diode in a contact hole on the substrate, the contact hole being formed using the underlayer pattern as an etching mask;
    forming a lower electrode on the diode;
    forming a phase change material layer pattern on the lower electrode; and
    forming an upper electrode on the phase change material layer pattern.

10. The method as claimed in claim 9, wherein forming the diode in the contact hole on the substrate using the underlayer pattern as an etching mask includes:
    forming a first insulating interlayer on the substrate;
    forming the contact hole using the underlayer pattern as an etching mask, the contact hole being through the first insulating interlayer and exposing a top surface of the substrate;
    forming a silicon layer to fill the contact hole; and
    implanting impurities into the silicon layer.

11. The method as claimed in claim 10, further comprising, prior to forming the first insulating interlayer on the substrate, performing an ion implantation process on an upper portion of the substrate to form an impurity region therein,
    and wherein the diode contacts a top surface of the impurity region.

12. The method as claimed in claim 9, wherein forming the lower electrode on the diode includes:
    forming a second insulating interlayer on the first insulating interlayer, the second insulating interlayer having an opening therethrough, and the opening partially exposing a top surface of the diode;
    forming a lower electrode layer pattern on a sidewall of the opening; and
    partially etching the lower electrode layer pattern.

13. The method as claimed in claim 9, wherein forming the underlayer pattern on the substrate includes:

combining the PAG with polysiloxane to form a deposition source;

providing the deposition source to the substrate using a carrier gas to form an underlayer;

forming a photoresist layer on the underlayer;

irradiating EUV light onto the photoresist layer to form a photoresist pattern; and etching the underlayer anisotropically using the photoresist pattern as an etching mask.

14. A method of forming a pattern, the method comprising:

forming an underlayer on an etching target layer, the underlayer including a silicon polymer having a photoacid generator (PAG) combined therewith, and further including at least one of a hydroxyl group-containing cross linking agent and an adhesion reinforcing agent;

forming a photoresist layer on the underlayer;

irradiating extreme ultraviolet (EUV) light onto the photoresist layer such that an acid generated from the PAG migrates to the photoresist layer;

developing the photoresist layer to form a photoresist pattern; and etching the etching target layer using the photoresist pattern as an etching mask.

15. The method as claimed in claim 14, wherein forming the underlayer on the etching target layer includes carrying out a chemical vapor deposition (CVD) process in which the silicon polymer having the photoacid generator (PAG) combined therewith and further including at least one of a hydroxyl group-containing cross linking agent and an adhesion reinforcing agent, is used as a deposition source, the CVD process being carried out at a temperature of about 80° C. to about 400° C.

16. The method as claimed in claim 14, wherein etching the etching target layer includes:

etching the underlayer anisotropically using the photoresist pattern as an etching mask to form an underlayer pattern;

removing the photoresist pattern; and etching the etching target layer using the underlayer pattern as an etching mask.

17. The method as claimed in claim 14, further comprising forming a hard mask layer on the etching target layer prior to forming the underlayer.

* * * * *